(12) United States Patent
Hafez et al.

(10) Patent No.: US 8,101,471 B2
(45) Date of Patent: Jan. 24, 2012

(54) METHOD OF FORMING PROGRAMMABLE ANTI-FUSE ELEMENT

(75) Inventors: Walid M. Hafez, Portland, OR (US); Chia-Hong Jan, Portland, OR (US); Jie-Feng Lin, Portland, OR (US); Chetan Prasad, Hillsboro, OR (US); Sangwoo Pae, Beaverton, OR (US); Zhanping Chen, Portland, OR (US); Anisur Rahman, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 47 days.

(21) Appl. No.: 12/319,104

(22) Filed: Dec. 30, 2008

(65) Prior Publication Data

US 2010/0164603 A1  Jul. 1, 2010

(51) Int. Cl.
    *H01L 21/82* (2006.01)
(52) U.S. Cl. ........ 438/132; 438/131; 438/215; 438/281; 257/E21.592
(58) Field of Classification Search .......... 438/131, 438/132, 467, 600, 601, 215, 281, 602; 257/E21.592
    See application file for complete search history.

(56) References Cited

U.S. PATENT DOCUMENTS

| | | | | |
|---|---|---|---|---|
| 5,412,593 A | * | 5/1995 | Magel et al. | 365/96 |
| 6,515,931 B2 | * | 2/2003 | Marr et al. | 365/225.7 |
| 6,836,000 B1 | * | 12/2004 | Marr et al. | 257/530 |
| 7,256,471 B2 | * | 8/2007 | Min et al. | 257/530 |
| 7,378,718 B2 | * | 5/2008 | Tsutsui | 257/529 |
| 7,601,564 B2 | * | 10/2009 | Okayama | 438/131 |
| 2006/0092742 A1 | | 5/2006 | Paillet et al. | |
| 2007/0058473 A1 | | 3/2007 | Kouchi et al. | |
| 2007/0076463 A1 | | 4/2007 | Keshavarzi et al. | |
| 2008/0246098 A1 | * | 10/2008 | Kurjanowicz | 257/408 |
| 2008/0277756 A1 | * | 11/2008 | Min et al. | 257/529 |
| 2009/0080232 A1 | | 3/2009 | Chen et al. | |
| 2009/0207650 A1 | | 8/2009 | Braceras et al. | |
| 2009/0207655 A1 | | 8/2009 | Kalnitsky et al. | |
| 2009/0321838 A1 | * | 12/2009 | Sell et al. | 257/369 |

FOREIGN PATENT DOCUMENTS

JP  2000-123592 A  4/2000

OTHER PUBLICATIONS

International Search Report and Written Opinion received for PCT Application No. PCT/US2010/054919, mailed on Jun. 15, 2011, 11 pages.

* cited by examiner

*Primary Examiner* — Julio J Maldonado
(74) *Attorney, Agent, or Firm* — Laleh Jalali

(57) ABSTRACT

A programmable anti-fuse element includes a substrate (224), an N-well (426) in the substrate, an electrically insulating layer (427) over the N-well, and a gate electrode (430) over the electrically insulating layer. The gate electrode has n-type doping so that the N-well is able to substantially contain within its boundaries a current generated following a programming event of the programmable anti-fuse element. In the same or another embodiment, a twice-programmable fuse element (100) includes a metal gate fuse (110) and an oxide anti-fuse (120) such as the programmable anti-fuse element just described.

8 Claims, 6 Drawing Sheets

METHOD OF FORMING PROGRAMMABLE ANTI-FUSE ELEMENT

FIELD OF THE INVENTION

The disclosed embodiments of the invention relate generally to controlled electrical signaling in microelectronic devices, and relate more particularly to programmable fuse and anti-fuse elements.

BACKGROUND OF THE INVENTION

Programmable Read Only Memory (PROM) has become increasingly more important in the design of microelectronic devices and is used in an expanding variety of applications, including digital security, chip identification, device trimming, microprocessor yield improvement, and others. As further discussed below, a PROM cell can be implemented based on fuse or anti-fuse technology.

Fuses have a small initial resistance that changes to a much larger resistance following a "programming event." Fuses operate on the principle of electromigration/agglomeration, and large currents (e.g., tens of milliamps (mA)) are required to program existing fuse elements. In existing metal fuses programming occurs when electromigration of via material caused by large, sustained current flow creates an open (high-resistance) circuit. The operation of polysilicon fuses relies on the creation of a gap in the polysilicide that likewise creates a high-resistance current path. An anti-fuse, on the other hand, has a large initial resistance that changes to a smaller resistance after a programming event causes an oxide breakdown that enables current flow. A programming event, therefore, is an event, such as current pulse, that changes the resistance of a fuse, anti-fuse, or similar programmable device. As mentioned, the change can be from low resistances to high resistances or from high resistances to low resistances.

Increasing digital security requirements, such as the desire for digital content protection for set-top boxes, mandate large arrays of encrypted PROM cells. The number of programmable (fuse or anti-fuse) elements required by digital security applications has grown from tens of bits in previous generations to projected sizes of tens of megabytes for future implementations. Code-storage and code-change, error correction, yield improvement, and other applications will likely also require increasingly larger numbers of PROM elements.

BRIEF DESCRIPTION OF THE DRAWINGS

The disclosed embodiments will be better understood from a reading of the following detailed description, taken in conjunction with the accompanying figures in the drawings in which.

Figure 1:
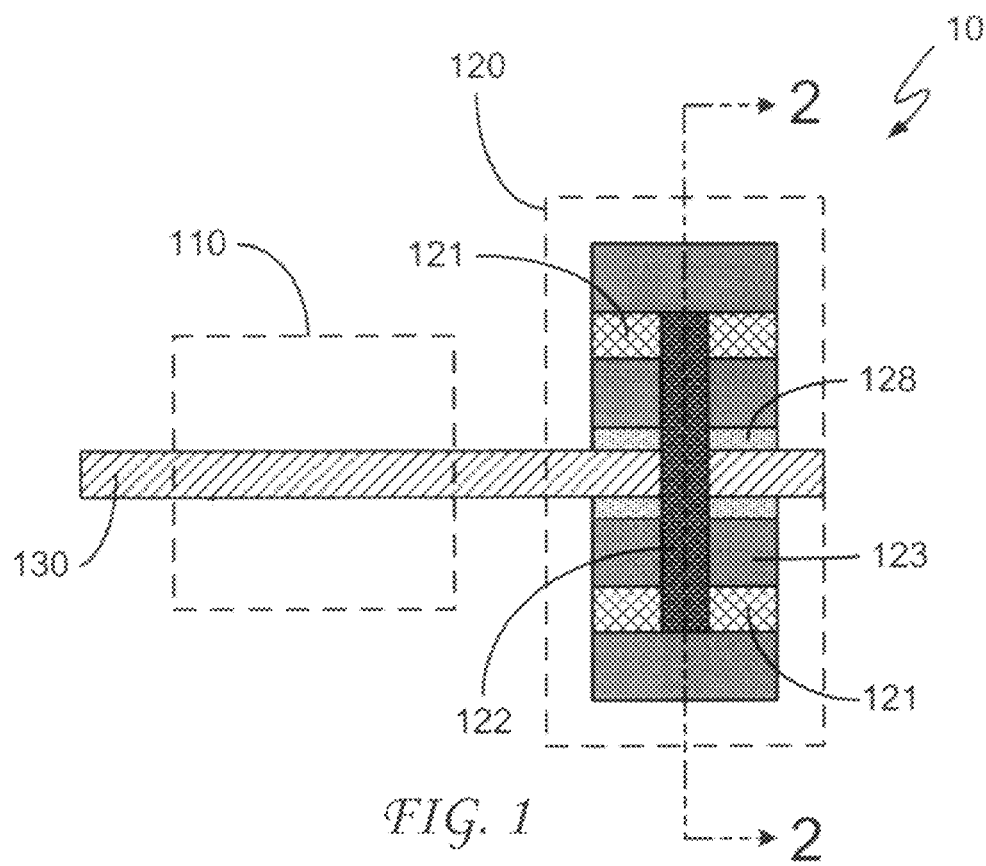
FIG. 1 is a plan schematic view of a portion of a twice-programmable fuse element according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a programmable anti-fuse element comprises a semiconducting substrate, an N-well in the semiconducting substrate, an electrically insulating layer over the N-well, and a gate electrode over the electrically insulating layer. The gate electrode has n-type doping so that the N-well is able to substantially contain within its boundaries a current generated following a programming event of the programmable anti-fuse element. In the same or another embodiment, a twice-programmable fuse element comprises a metal gate fuse and a programmable oxide anti-fuse such as the anti-fuse just described.

As mentioned above, PROM applications require, or will soon require, programmable fuse or anti-fuse elements in array sizes of several megabytes or larger. Because of emerging process limitations, and due in part to the large programming currents required, such large arrays constructed using existing PROM technology would inflict an enormous die size penalty, thus forcing expensive off-chip implementation. Embodiments of the invention address this lack of scalability by using a metal gate fuse as an alternate fuse topology. The energy required to program these new fuse elements scales with gate length and height, thus taking advantage of the superior scaling of gate dimensions and rendering such embodiments more readily compatible with future microprocessor generations. Similarly, embodiments of the invention take advantage of expected future-generation oxide scaling to enable lower anti-fuse programming voltages, thus enabling smaller programming transistors.

Embodiments of the invention enable the formation of a secure fuse bitcell that is compatible with current and future process technologies, e.g., by supporting high-k/metal gate implementations where polysilicon has been replaced with a metal-gate structure, and, as mentioned, address scalability with a fuse element structure and associated programming scheme that enable the construction of a large bit array with a minimum footprint. For example, the gate lines of a metal gate fuse can be printed with geometries that are orders of magnitude smaller than the geometries of metal/via fuses, and therefore will fuse at much lower current levels. In other words, the current density is much higher in a metal gate fuse for a given programming current than it is at that programming current in an existing metal fuse or polysilicon fuse, thus improving the programmability of the metal gate fuse element. Furthermore, the low melting point of a metal gate material will further facilitate programming at lower temperatures than is possible with polysilicides. Such characteristics may enable enhanced digital security applications, permanent storage of die identification ("chip-id"), effective device trimming, improved microprocessor yield (e.g., by repairing defective SRAM bits using row/column redundancy) and similar advances.

Certain embodiments of the invention utilize scaling of gate dimensions and oxide thicknesses to generate a memory element capable of being programmed (i.e., changed from a first resistance level to a second resistance level), and then unprogrammed (i.e., changed back to the first resistance level). Such twice-programmable fuse elements may allow easier implementation of redundancy, error correction, and the like as well as more robust core storage, more flexible code change, and so forth than is possible using a one-time-programmable (OTP) memory array.

Anti-fuse programming voltage needs to be low enough that it minimizes the risk of oxide damage, mitigates gate dielectric reliability risks, and doesn't hurt other circuitry, while also maintaining acceptable programming yields. Existing anti-fuse designs based on regular inversion-mode PMOS transistors have higher breakdown voltages than do NMOS-based anti-fuses, requiring higher programming voltage and leading to greater oxide reliability risk on surrounding circuitry. At the same time, post-breakdown current for an NMOS-based device flows directly into the substrate, causing PROM sense amplifier malfunction.

Embodiments of the invention combine the benefits of NMOS-based and PMOS-based devices while overcoming at least some of the disadvantages discussed above. Such embodiments use a gate-blocked N-well (GBNWELL) as an anti-fuse element in order to lower programming voltage. The GBNWELL device contains the post-breakdown current inside the N-well so that a sense amplifier can read out its correct value.

Figure 2:
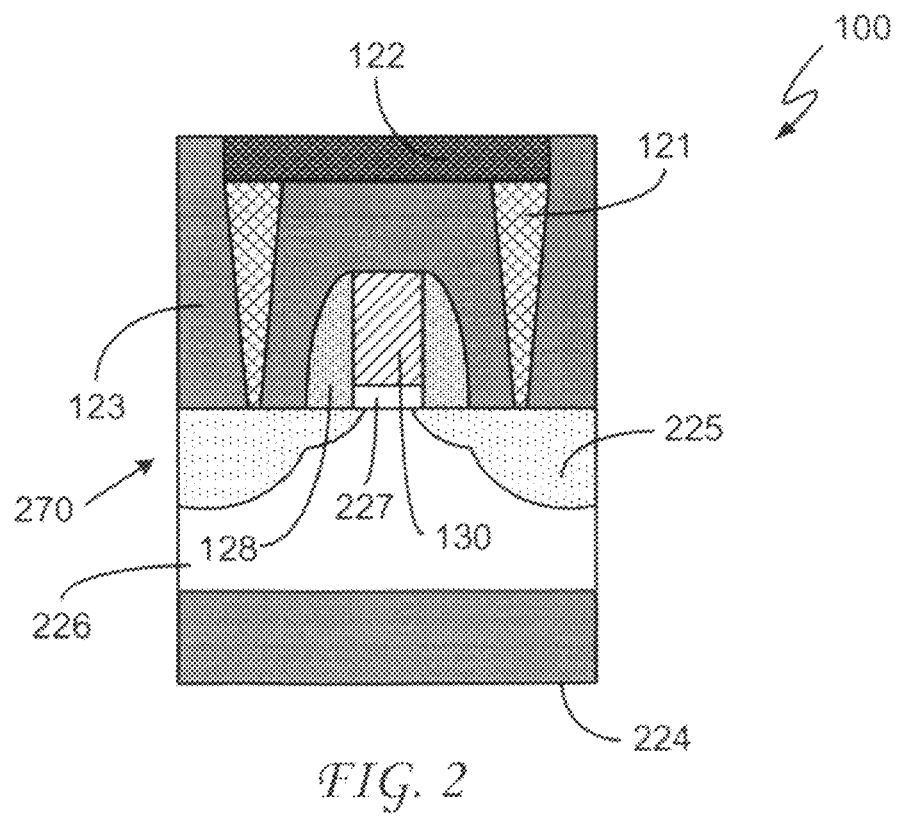
FIG. 2 is a cross-sectional view of the twice-programmable fuse element of FIG. 1 according to an embodiment of the invention.

Referring now to the drawings, FIG. 1 is a plan schematic view of a portion of twice-programmable fuse element 100 according to an embodiment of the invention. FIG. 2 is a cross-sectional view of twice-programmable fuse element 100 taken along a line 2-2 in FIG. 1. As illustrated in FIGS. 1 and 2, twice-programmable fuse element 100 comprises a metal gate fuse 110 and an oxide anti-fuse 120. Twice-programmable fuse element 100 further comprises a gate electrode 130 which, in the illustrated embodiment, is the gate connection of oxide anti-fuse 120.

Oxide anti-fuse 120 comprises trench contacts 121 tied together with a strap 122 and extend from strap 122 through an electrically insulating material 123 to a substrate 224. Strap 122 is used to short the source/drain region together, effectively creating a capacitor structure and simplifying the voltage timings required for fusing, i.e., there is only one pin to set "low" (source and drain together) rather than two pins simultaneously (one each for the source and drain). (It may be seen that this anti-fuse is not a functional transistor but rather functions as a capacitor.) Substrate 224 contains source/drain regions 225 located within a body region 226 of substrate 224. Source/drain regions 225 and gate electrode 130 are terminals of a transistor 270. A gate insulator 227 is located between substrate 224 and gate electrode 130, and sidewall spacers 128 are adjacent to gate electrode 130 over substrate 224. In one embodiment, gate insulator 227 can be a high-k dielectric material.

In one embodiment, body region 226 comprises an N-well in substrate 224 and gate electrode 130 has an n-type doping so that the N-well is able to substantially contain within its boundaries a current generated following a programming event of oxide anti-fuse 120. (The N-gate on N-well geometry constitutes a GBNWELL structure.) As an example, the programming event of oxide anti-fuse 120 can comprise an exposure of twice-programmable fuse element 100 to an electric signal or pulse that is sufficient to break down gate insulator 227 of oxide anti-fuse 120, thereby creating a current path through oxide anti-fuse 120. In at least one embodiment, such an electric signal will be one having a relatively high voltage (perhaps approximately 4V, for example), and relatively low current (for example, in the range of tens to hundreds of microamps ($\mu A$)).

The GBNWELL structure can be advantageous in that it takes beneficial features from both PMOS and NMOS devices, as will now be explained. A regular inversion mode NMOS transistor, when used as an anti-fuse, has a lower breakdown voltage—on the order of perhaps 500 millivolts (mV) lower—than does a regular inversion mode PMOS transistor. This means that the NMOS transistor requires a lower programming voltage, which leads to lower oxide reliability risk on associated circuitry. On the other hand, NMOS transistors allow post-breakdown current to flow directly into the substrate, causing PROM sense amplifier malfunction. The GBNWELL structure features the lower gate breakdown voltage of an NMOS device and the leakage containment of a PMOS device. Anti-fuse elements according to embodiments of the invention can be designed either in separate N-wells or in common wells.

Figure 3A:
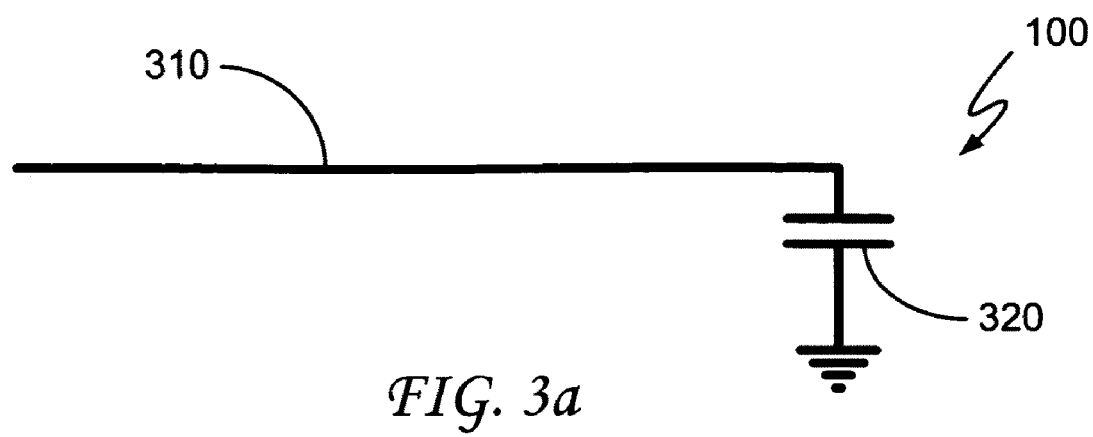
FIGS. 3a-3c are equivalent circuit representations of the twice-programmable fuse element of FIGS. 1 and 2 in various programming states according to an embodiment of the invention.
Figure 3B:
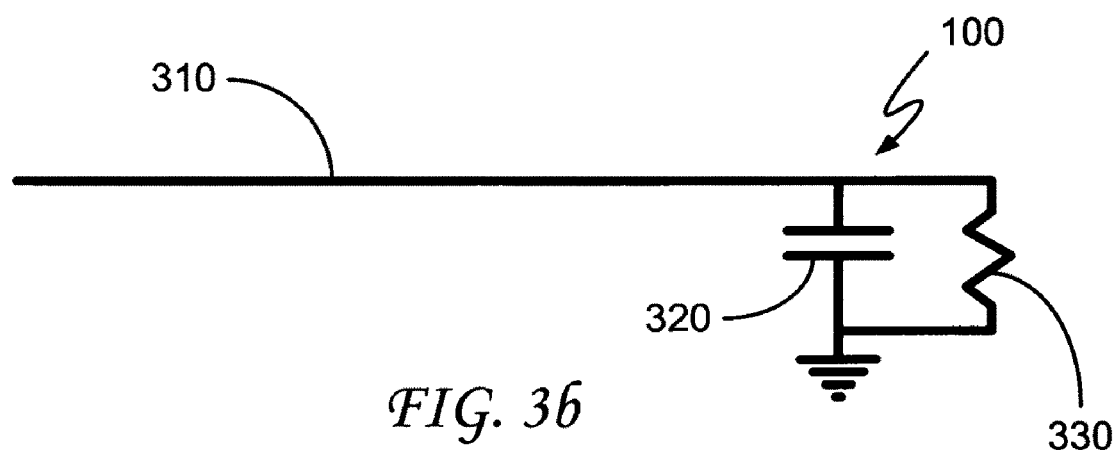
Figure 3C:
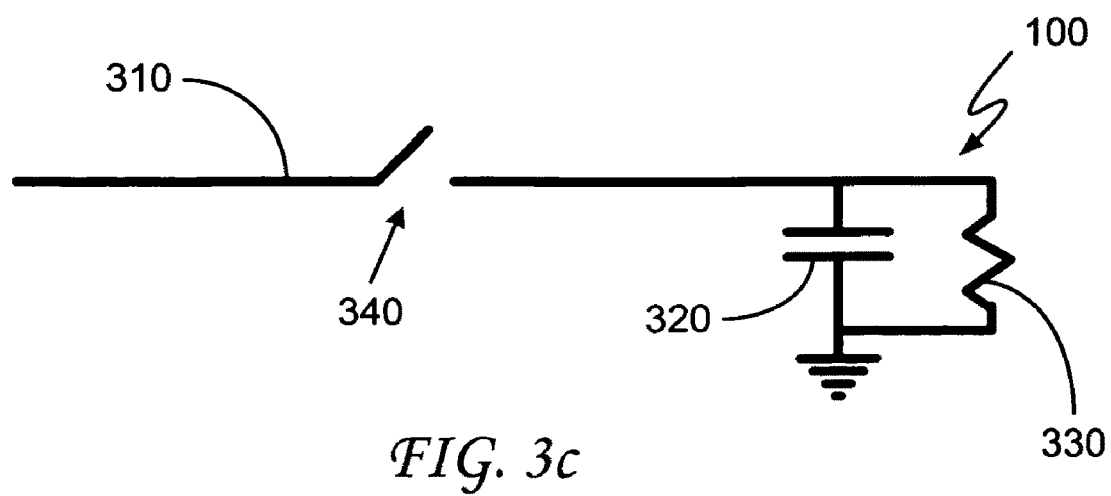

In the same or another embodiment, metal gate fuse 110 and oxide anti-fuse 120 are connected to each other in series. This is illustrated in FIGS. 3a-3c, which are equivalent circuit representations of twice-programmable fuse element 100 in various programming states according to an embodiment of the invention. The phrase "programming state" as used herein refers to the condition of a programmable device relative to a programming event (which was identified above as an event that changes the resistance of a fuse, anti-fuse, or similar programmable device). As an example, a programmable device may be in a first programming state prior to a programming event and in a second programming state after the programming event. A related concept is the "conduction state." This is a reference to the relative ease with which an electric signal propagates through the programmable device at a particular point in time relative to a programming event. For example, the programmable device may be in a first conduction state prior to the programming event and in a second conduction state after it. Note that a given conduction state can be a high-resistance (i.e., a low conduction) state.

FIG. 3a is an equivalent circuit representation of twice-programmable fuse element 100 in an initial, pre-programmed state in which metal gate fuse 110 and oxide anti-fuse 120 of FIGS. 1 and 2 are represented, respectively, by a low-resistance gate line 310 and a parallel plate capacitor 320. This initial state may be called a first high-resistance state. In one embodiment, twice-programmable fuse element 100 in this initial, pre-programmed state (i.e., the first high-resistance state) may admit a current of only approximately $1\,e^{-9}$ Amperes (A).

FIG. 3b is an equivalent circuit representation of twice-programmable fuse element 100 after a first programming event (e.g., a high-voltage, low current pulse) that breaks through gate insulator 227 of oxide anti-fuse 120 and shorts gate electrode 130 to source/drain region 225 of oxide anti-fuse 120. In one embodiment, for example, the first programming event or programming current may comprise a current pulse of 0.2 mA. The shorted anti-fuse is represented by parallel plate capacitor 320 with a resistor 330 in parallel. This geometry results in a low-resistance state, which typically (though not necessarily) is at least approximately four orders of magnitude lower in resistance than the initial state. In one embodiment, for example, twice-programmable fuse element 100 in this post-programming, low-resistance state may admit a current of approximately $1\,e^{-4}$ Amperes (A), i.e., 0.1 mA—ten thousand times or five orders of magnitude higher than the current admitted in the pre-programmed state.

To un-program twice-programmable fuse element 100, a second current pulse is applied to the element. In one embodiment, this second current pulse, which constitutes a second programming event, may be a current on the order of approximately 0.6 mA. The large current flow is confined to the highly-scaled metal gate, generating a high current density inside the metal gate that creates a void 340 in gate line 310. The presence of void 340 yields an open circuit along the gate line that results in a second high-resistance state. This is illustrated by the equivalent circuit of FIG. 3c. The cell has now been "un-programmed," meaning that the current it admits drops back to pre-programming levels (approximately $1\,e^{-9}$ A). In a different embodiment, the second current pulse is not strong enough to cause a breakdown or a void in gate line 310. Such a current pulse, which may have an intensity of, for example, no more than approximately 0.2 mA, thus does not constitute a programming current or a programming event, but rather leaves twice-programmable fuse element 100 in the low-resistance state described above in which the admitted current may be approximately 0.1 mA. Such lower intensity pulses may therefore be used as read events or the like. Subsequent stronger pulses may drop the element back down to the pre-programmed levels described above.

Depending on the current level used to un-program twice-programmable fuse element 100, the second high-resistance state can have a resistance that is perhaps 10 to 100 times higher than that of the first high-resistance state of FIG. 3a. In that scenario, the ratio of the first resistance value to the second resistance value can be further exploited as another discrete programming state.

Figure 4:
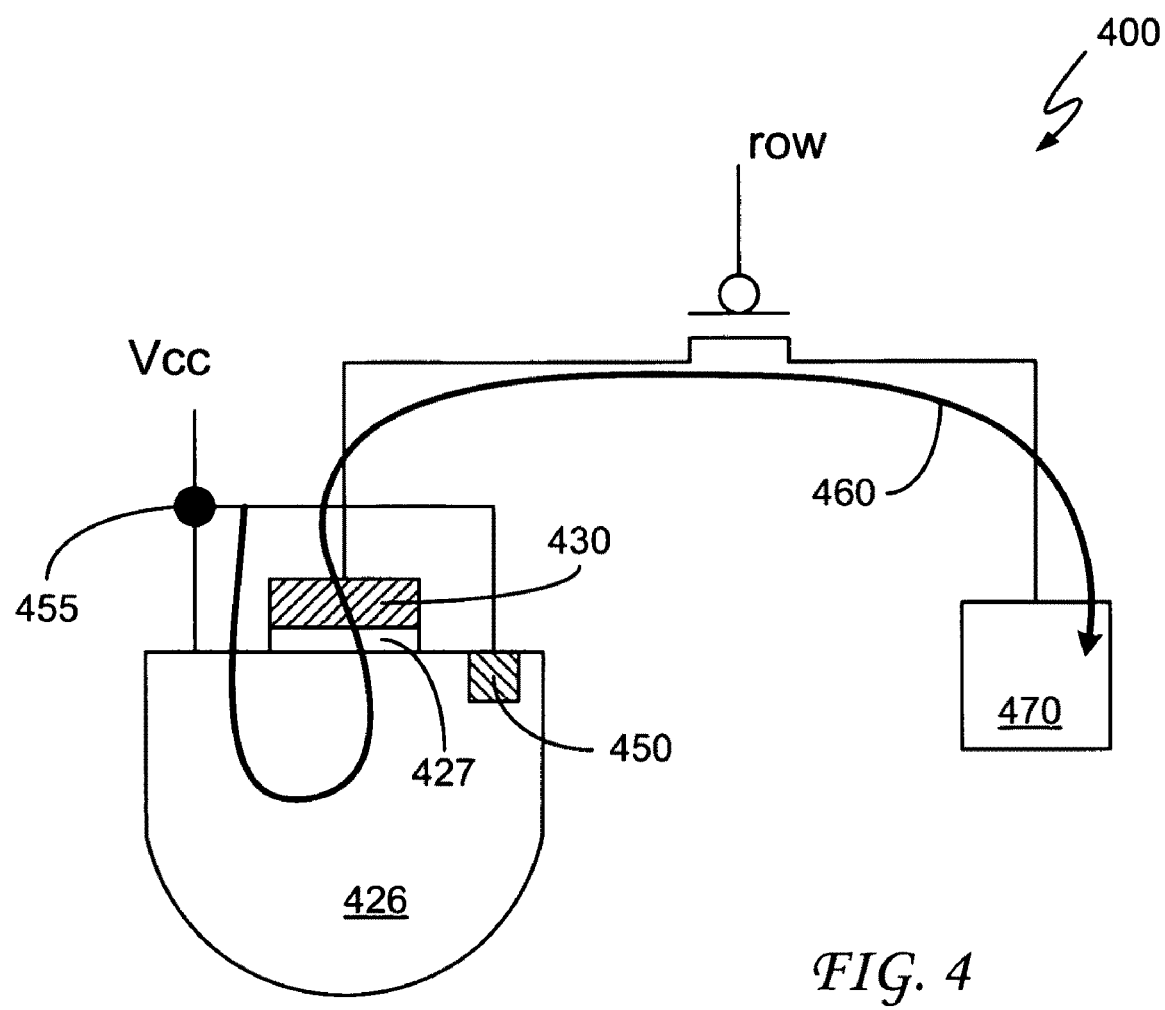
FIG. 4 is a schematic representation of a programmable anti-fuse element according to an embodiment of the invention.

In one embodiment, a programmable anti-fuse element such as oxide anti-fuse 120 further comprises a sensing element, such as a sense amplifier or the like, electrically connected to the N-well. An example of this is depicted in FIG. 4, which is a schematic representation of a programmable anti-fuse element 400 according to an embodiment of the invention. As an example, programmable anti-fuse element 400 can be similar to oxide anti-fuse 120 that is first shown in FIG. 1. As an example, programmable anti-fuse element 400 can be part of an anti-fuse array (not shown) that comprises a plurality of similar programmable anti-fuse cells.

As illustrated in FIG. 4, programmable anti-fuse element 400 comprises a gate insulator 427 and a gate electrode 430 over an N-well 426. As an example, gate insulator 427, gate electrode 430, and N-well 426 can be similar to, respectively, gate insulator 227, gate electrode 130, and body region 226, each of which are shown in FIG. 1 or 2. More generally, programmable anti-fuse element 400 can be similar to oxide anti-fuse 120 that is shown in FIGS. 1 and 2. A body terminal 450 is located in N-well 426 and is electrically connected to a nominal supply voltage 455. Although N-well 426 could further contain source/drain regions, such regions are not depicted in FIG. 4, indicating that source/drain regions are not a required element of programmable anti-fuse element 400. (It should be noted here that source/drain regions 225 are similarly not a required element of oxide anti-fuse 120, in spite of their presence in FIG. 2.) As illustrated, after programmable anti-fuse element 400 is programmed (i.e., after gate insulator 427 breaks down), a post-breakdown current 460 is contained within N-well 426 and is then directed to a sensing element such as a sense amplifier 470. By comparing post-breakdown current 460 with a reference the anti-fuse cell can read out the correct state.

Figure 5:
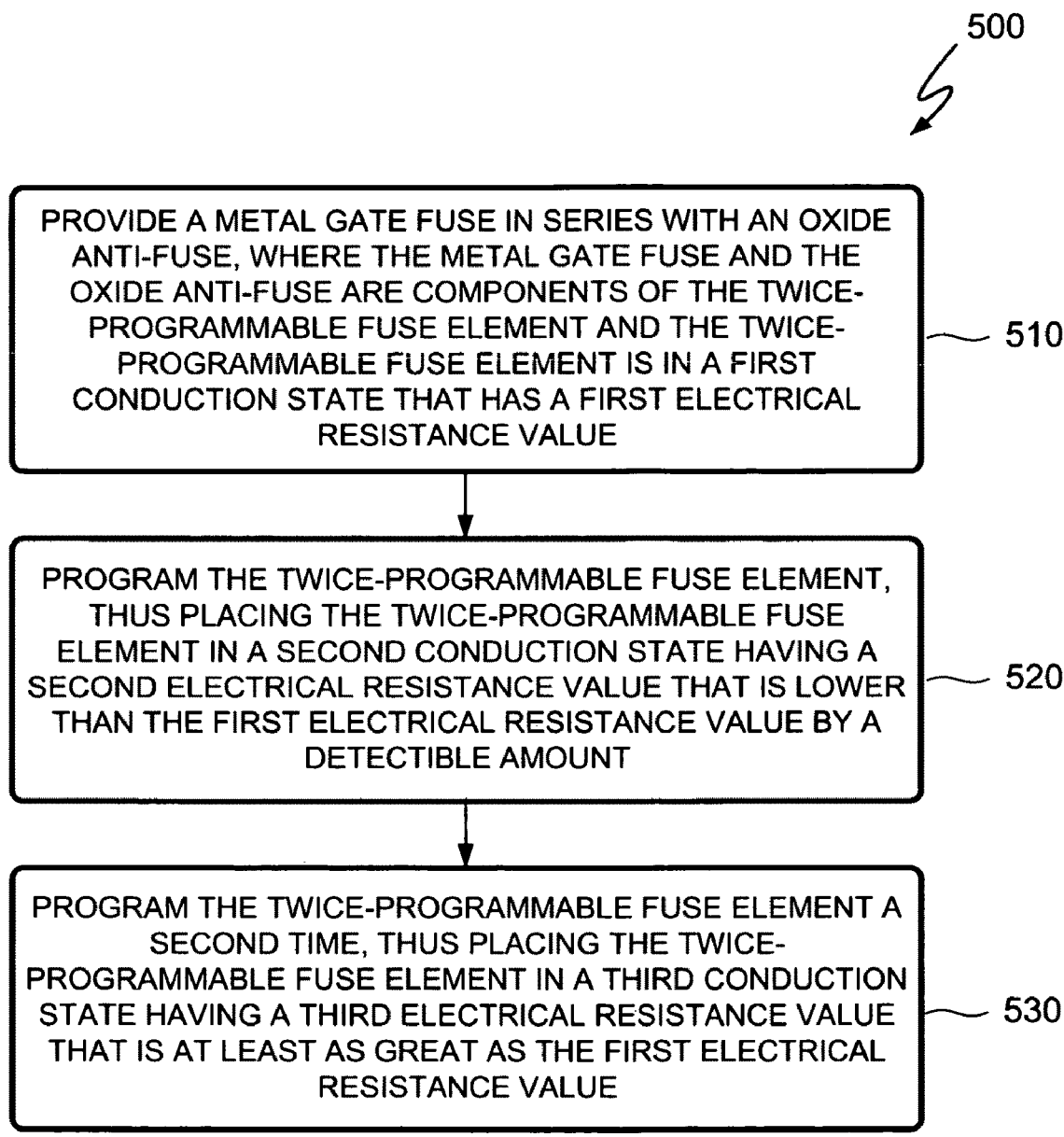
FIG. 5 is a flowchart illustrating a method of changing a conduction state of a twice-programmable fuse element according to an embodiment of the invention.

FIG. 5 is a flowchart illustrating a method 500 of changing a conduction state of a twice-programmable fuse element according to an embodiment of the invention.

A step 510 of method 500 is to provide a metal gate fuse in series with an oxide anti-fuse, where the metal gate fuse and the oxide anti-fuse are components of the twice-programmable fuse element and the twice-programmable fuse element is in a first conduction state that has a first electrical resistance value. As an example, the metal gate fuse can be similar to metal gate fuse 110 that is shown in FIG. 1. As another example, the oxide anti-fuse can be similar to oxide anti-fuse 120 that is first shown in FIG. 1. Accordingly, the first conduction state can be a first high-resistance state that is similar to that described above in the discussion of FIGS. 3a-3c.

A step 520 of method 500 is to program the twice-programmable fuse element, thus placing the twice-programmable fuse element in a second conduction state having a second electrical resistance value that is lower than the first-electrical resistance value by a detectable amount. In one embodiment, a sense amplifier may be used to detect the state difference between an un-fused (i.e., un-programmed) and a fused (i.e., programmed) element. A typical embodiment may see a difference between first and second electrical resistance values equal to three or four orders of magnitude or more, though a robust sense amplifier can detect differences of less than two orders of magnitude.

In one embodiment, step 520 comprises applying to the twice-programmable fuse element a first electric signal that is sufficient to break down a gate insulator of the oxide anti-fuse. As an example, the first electric signal can be an electric pulse having a relatively high voltage—perhaps approximately 2 or 3 Volts in one embodiment—and a relatively low current—perhaps approximately 0.2 mA in one embodiment. As another example, the gate insulator can be similar to gate insulator 227 that is shown in FIG. 2. It should be understood that the twice-programmable fuse element may be used indefinitely in this programmed state. In other words, the twice-programmable fuse element may have value even if only programmed once. For various reasons, however, it may be desirable to program the twice-programmable fuse element twice. As an example, this may be accomplished using step 530 (discussed below).

A step 530 of method 500 is to program the twice-programmable fuse element a second time, thus placing the twice-programmable fuse element in a third conduction state having a third electrical resistance value that is at least as great as the first electrical resistance value. In one embodiment, step 530 comprises applying to the twice-programmable fuse element a second electric signal sufficient to create a void in a gate material of the metal gate fuse. As an example, the second electric signal can be a high current pulse—perhaps approximately 0.6 mA in one embodiment. As another example, the void (and its effects) can be similar to void 340 (and its effects) as detailed above in connection with FIG. 3c.

In one embodiment, the second electric signal has an intensity sufficient to ensure the third electrical resistance value is at least approximately an order of magnitude greater than the first electrical resistance value. As an example, this third electrical resistance value can be characteristic of a separate discrete programming state.

Figure 6:
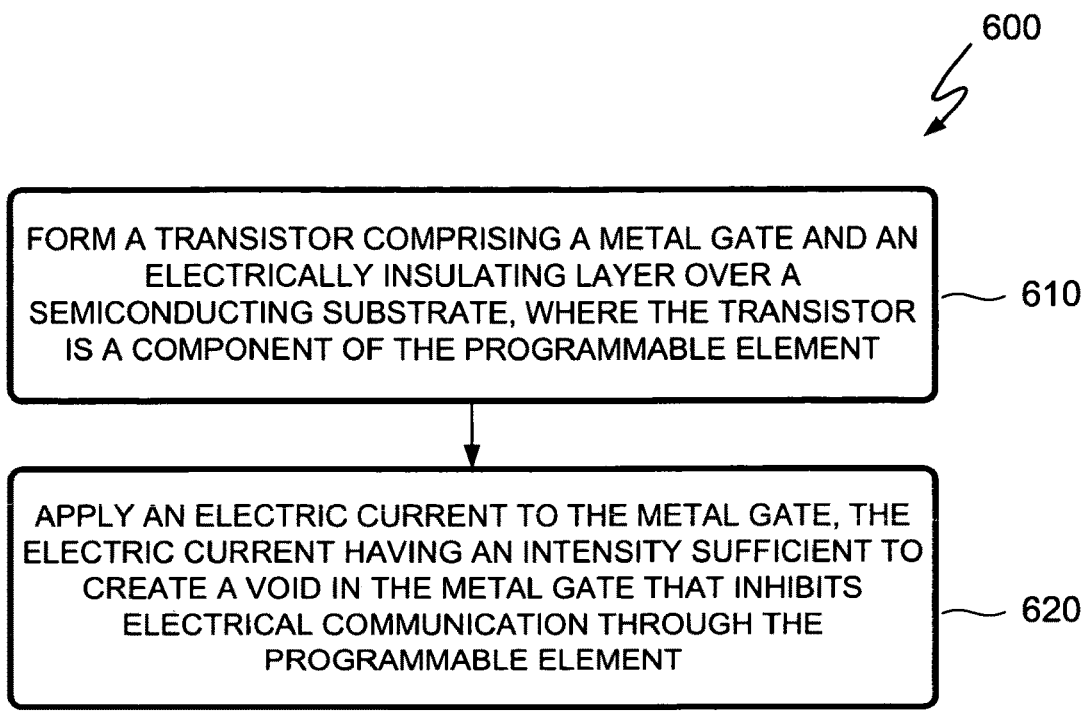
FIG. 6 is a flowchart illustrating a method of inhibiting electrical communication through a programmable element according to an embodiment of the invention.

FIG. 6 is a flowchart illustrating a method 600 of inhibiting electrical communication through a programmable element according to an embodiment of the invention.

A step 610 of method 600 is to form a transistor comprising a metal gate and an electrically insulating layer over a semiconducting substrate, where the transistor is a component of the programmable element. As an example, the transistor can be similar to transistor 270 that is shown in FIG. 2. Accordingly, the metal gate and the electrically insulating layer can be similar to, respectively, gate electrode 130, first shown in FIG. 1, and gate insulator 227, shown in FIG. 2. In one embodiment, step 610 may be accomplished using a replacement-gate process flow as known in the art. In another embodiment, step 610 may be accomplished using a gate-first process flow according to techniques that are also known in the art.

Figure 7A:
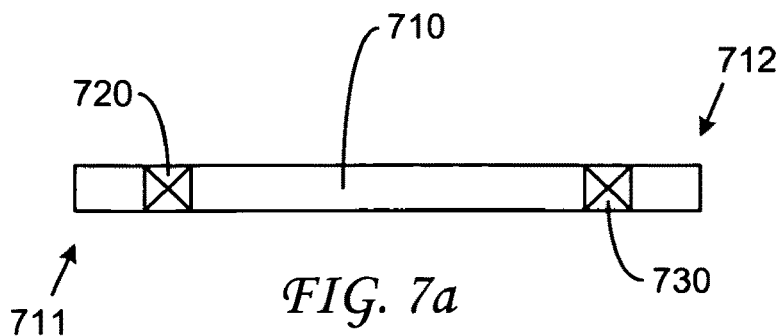
FIGS. 7a and 7b are plan views of a portion of a metal gate line according to an embodiment of the invention before and after a programming event.
Figure 7B:
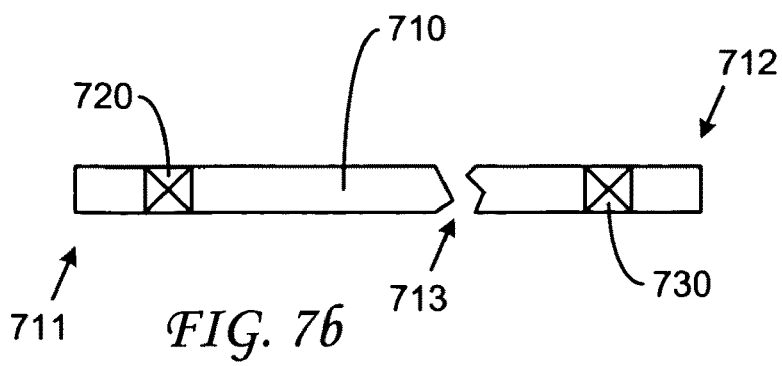

A step 620 of method 600 is to apply an electric current to the metal gate, the electric current having an intensity sufficient to create a void in the metal gate that inhibits electrical communication through the programmable element. As an example, the void can be similar to void 340 that is discussed in connection with FIG. 3c. In one embodiment, step 620 comprises ensuring that the intensity of the electric current yields a post-programming resistance value of the programmable element that is larger than a pre-programming resistance value of the programmable element by some detectible amount. As discussed above, a typical difference between pre- and post-programming resistance values might be roughly four orders of magnitude, but detectible amounts include differences that are far smaller—perhaps two orders of magnitude or even less. As an example, step 620 may be accomplished by contacting a first side of the metal gate with an anode and contacting an opposing second side of the metal gate with a cathode. This is illustrated in FIGS. 7a and 7b, which are plan views of a portion of a metal gate line 710 according to an embodiment of the invention. As shown, metal gate line 710 is contacted at a side 711 by an anode 720 and at an opposing side 712 by a cathode 730. FIG. 7a shows metal gate line 710 prior to a programming event, while FIG. 7b shows metal gate line 710 after the programming event has opened up a void 713 in the gate line.

Figure 8:
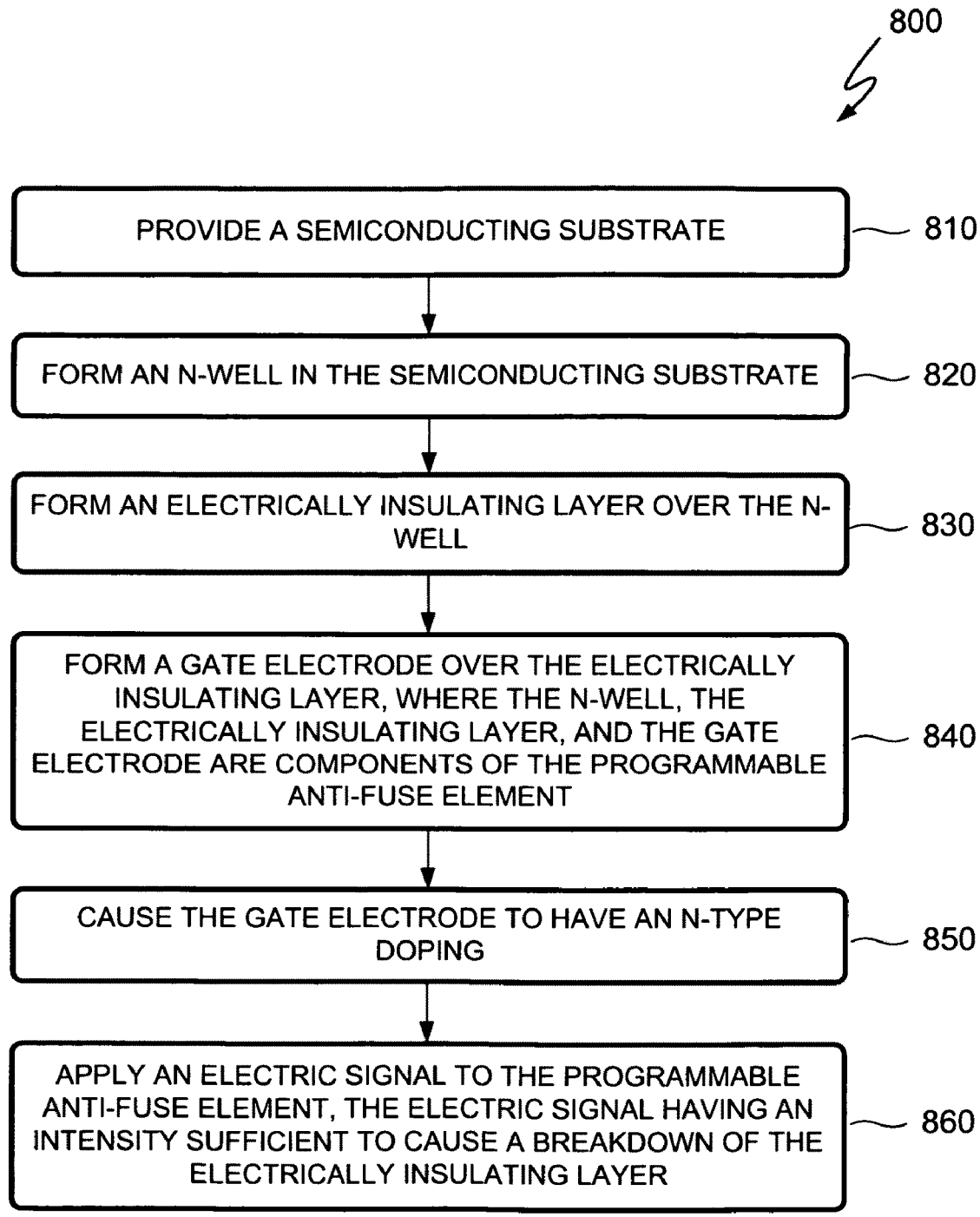
FIG. 8 is a flowchart illustrating a method of enabling electrical communication through a programmable anti-fuse element according to an embodiment of the invention.

FIG. 8 is a flowchart illustrating a method 800 of enabling electrical communication through a programmable anti-fuse element according to an embodiment of the invention. As an example, the programmable anti-fuse element can be similar to oxide anti-fuse 120.

A step 810 of method 800 is to provide a semiconducting substrate. As an example, the semiconducting substrate can be similar to substrate 224 that is shown in FIG. 2.

A step 820 of method 800 is to form an N-well in the semiconducting substrate. As an example, the N-well can be similar to N-well 426 that is shown in FIG. 4.

A step 830 of method 800 is to form an electrically insulating layer over the N-well. As an example, the electrically insulating layer can be similar to gate insulator 227 that is shown in FIG. 2.

A step 840 of method 800 is to form a gate electrode over the electrically insulating layer, where the N-well, the electrically insulating layer, and the gate electrode are components of the programmable anti-fuse element. As an example, the gate electrode can be similar to gate electrode 130 that is first shown in FIG. 1.

A step 850 of method 800 is to cause the gate electrode to have an n-type doping. In one embodiment, step 850 comprises implanting an n-type doping species into the gate electrode.

A step 860 of method 800 is to apply an electric signal to the programmable anti-fuse element, the electric signal having an intensity sufficient to cause a breakdown of the electrically insulating layer. In one embodiment, method 800 further comprises confirming the breakdown of the electrically insulating layer by comparing a post-breakdown current with a reference current using a sensing element such as sense amplifier 470 that is shown in FIG. 4.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the programmable devices and the related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of forming a programmable element comprising forming an anti-fuse transistor that is part of the programmable element, forming the transistor comprising:
    providing a semiconductor substrate including an N-well therein;
    providing a gate insulating layer over the substrate;
    providing a metal gate over the gate insulating layer including providing n-type doping of the gate;
    wherein the gate insulating layer is adapted to undergo a breakdown yielding a short between the gate and the N-well in the substrate in response to a first electric current applied to the gate;
    wherein the gate is adapted to undergo voiding yielding an open circuit in response to a second electric current applied to the gate, the second electric current being larger than the first electric current; and
    wherein an electrical resistance of the programmable element after voiding is greater than an electrical resistance of the programmable element after breakdown.

2. The method of claim 1, wherein the gate insulating layer comprises an oxide.

3. The method of claim 1, wherein the gate insulating layer comprises a high-k material.

4. The method of claim 1, wherein:
    forming the programmable element comprises forming a plurality of identical programmable elements;
    providing the N-well comprises providing one of respective N-wells for respective ones of the programmable elements and a common N-well for all of the programmable elements.

5. The method of claim 1, further comprising:
    providing a source region and a drain region for the gate electrode;
    providing an electrical short between the source region and the drain region.

6. The method of claim 1, wherein an electrical resistance of the programmable element after the breakdown is approximately four orders of magnitude lower than an electrical resistance of the programmable element before the breakdown.

7. The method of claim 1, wherein the electrical resistance of the programmable element after voiding is 10 to 100 times higher than an electrical resistance of the programmable element after breakdown.

8. The method of claim 1, further comprising providing a sense amplifier coupled to the N-well to receive a post-breakdown current contained within the N-well and to compare the post-breakdown current with a reference current.

* * * * *